US009601163B2

(12) United States Patent
Song et al.

(10) Patent No.: US 9,601,163 B2
(45) Date of Patent: *Mar. 21, 2017

(54) MEMORY MODULE AND MEMORY SYSTEM

(71) Applicant: Samsung Electronics Co., Ltd., Suwon-si, Gyeonggi-do (KR)

(72) Inventors: Won-Hyung Song, Osan-si (KR); Kyoungsun Kim, Uijeongbu-si (KR); Yong-Jin Kim, Incheon (KR); Jaejun Lee, Seongnam-si (KR); Sangseok Kang, Suwon-si (KR); Jungjoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/168,961

(22) Filed: May 31, 2016

(65) Prior Publication Data
US 2016/0275995 A1 Sep. 22, 2016

Related U.S. Application Data

(60) Continuation of application No. 14/712,530, filed on May 14, 2015, now Pat. No. 9,361,948, which is a
(Continued)

(30) Foreign Application Priority Data

Feb. 14, 2013 (KR) ........................ 10-2013-0015898

(51) Int. Cl.
G11C 5/04 (2006.01)
H01L 25/07 (2006.01)
(Continued)

(52) U.S. Cl.
CPC .............. *G11C 5/04* (2013.01); *G06F 13/102* (2013.01); *G06F 13/4068* (2013.01);
(Continued)

(58) Field of Classification Search
CPC .............. H01L 25/074; H01L 25/0657; H01L 2224/32145; H01L 2224/48227;
(Continued)

(56) References Cited

U.S. PATENT DOCUMENTS 6,937,494 B2 8/2005 Funaba et al.
7,072,201 B2 7/2006 So et al.
(Continued)

FOREIGN PATENT DOCUMENTS

KR 100585099 B1 5/2006

Primary Examiner — Roy Potter
(74) Attorney, Agent, or Firm — Harness, Dickey & Pierce, P.L.C.

(57) ABSTRACT

A memory module is provided which includes a printed circuit board; first semiconductor packages provided on one surface of the printed circuit board; and second semiconductor packages provided on the other surface of the printed circuit board, the first semiconductor packages and the second semiconductor packages having semiconductor dies that form ranks. A number of the ranks formed by the first semiconductor packages being different from a number of the ranks formed by the second semiconductor packages. Semiconductor packages forming a same one of the ranks receive a chip selection signal in common and semiconductor packages forming other ranks receive a different chip selection signal.

20 Claims, 9 Drawing Sheets

Related U.S. Application Data division of application No. 13/826,612, filed on Mar. 14, 2013, now Pat. No. 9,070,572.

(60) Provisional application No. 61/726,736, filed on Nov. 15, 2012.

(51) Int. Cl.

| | |
|---|---|
| *H01L 25/065* | (2006.01) |
| *G11C 5/02* | (2006.01) |
| *G06F 13/10* | (2006.01) |
| *G06F 13/40* | (2006.01) |
| *G06F 13/42* | (2006.01) |
| *H01L 23/00* | (2006.01) |

(52) U.S. Cl.
CPC ............... *G06F 13/42* (2013.01); *G11C 5/02* (2013.01); *H01L 25/0657* (2013.01); *H01L 25/074* (2013.01); *H01L 24/73* (2013.01); *H01L 2224/32145* (2013.01); *H01L 2224/32225* (2013.01); *H01L 2224/48227* (2013.01); *H01L 2224/73265* (2013.01); *H01L 2225/0651* (2013.01); *H01L 2225/06565* (2013.01); *H01L 2225/1023* (2013.01); *H01L 2225/1058* (2013.01); *H01L 2924/12044* (2013.01); *H01L 2924/1533* (2013.01); *H01L 2924/15311* (2013.01); *H01L 2924/15331* (2013.01)

(58) Field of Classification Search
CPC ... H01L 2224/73265; H01L 2225/0651; H01L 2225/1023; H01L 2225/1058; H01L 2924/15311; H01L 2924/1533; H01L 2225/06565; H01L 2224/32225; H01L 2924/15331; H01L 24/73; H01L 2924/12044; G11C 5/02

See application file for complete search history.

(56) References Cited

U.S. PATENT DOCUMENTS

| | | | |
|---|---|---|---|
| 7,102,905 | B2 | 9/2006 | Funaba et al. |
| 7,227,796 | B2 | 6/2007 | Lee et al. |
| 7,498,834 | B2* | 3/2009 | Kim ............... G11C 7/1051 326/26 |
| 7,894,231 | B2 | 2/2011 | Kim et al. |
| 8,089,795 | B2 | 1/2012 | Rajan et al. |
| 8,275,936 | B1 | 9/2012 | Haywood et al. |
| 9,070,572 | B2* | 6/2015 | Song ............... H01L 25/0657 |
| 9,361,948 | B2* | 6/2016 | Song ............... H01L 25/074 |
| 2004/0221186 | A1 | 11/2004 | Lee et al. |
| 2005/0036350 | A1 | 2/2005 | So et al. |
| 2005/0047250 | A1* | 3/2005 | Ruckerbauer ......... G11O 5/063 365/222 |
| 2005/0099834 | A1 | 5/2005 | Funaba et al. |
| 2005/0105318 | A1 | 5/2005 | Funaba et al. |
| 2007/0195613 | A1 | 8/2007 | Rajan et al. |
| 2010/0020583 | A1 | 1/2010 | Kang et al. |
| 2010/0142244 | A1 | 6/2010 | Kim et al. |
| 2010/0262751 | A1 | 10/2010 | Avudaiyappan |
| 2011/0252193 | A1 | 10/2011 | Bains et al. |
| 2012/0102292 | A1 | 4/2012 | Rajan et al. |
| 2012/0159061 | A1 | 6/2012 | Hampel et al. |

* cited by examiner

Fig. 2

| # of Ranks | 1066 Mbps | 1333 Mbps | 1600 Mbps |
|---|---|---|---|
| 1 | Supported | | |
| 2 | Supported | | |
| 4 | Supported | Not Supported | |

| # of Ranks per Channel (Module) | First side | Second side |
|---|---|---|
| 3 | Package including 2 stacked dies | Package including 2 mono die |
| 5 | Package including 3 stacked dies | Package including 3 stacked dies |
| 6 | Package including 3 stacked dies | Package including 3 stacked dies |
| 7 | Package including 4 stacked dies | Package including 4 stacked dies |

⋮

MEMORY MODULE AND MEMORY SYSTEM

CROSS-REFERENCE TO RELATED APPLICATIONS

This application is a continuation application of U.S. application Ser. No. 14/712,530 filed May 14, 2015, which is a divisional application of and claims priority under 35 U.S.C. §120/121 to U.S. application Ser. No. 13/826,612 filed Mar. 14, 2013, which claims priority under 35 U.S.C. §119 to U.S. Provisional Application No. 61/726,736 filed Nov. 15, 2012 and to Korean Patent Application No. 10-2013-0015898 filed Feb. 14, 2013, in the Korean Intellectual Property Office, the entire contents of each of which are hereby incorporated by reference.

BACKGROUND

The example embodiments described herein relate to a semiconductor memory, and more particularly, relate to a memory module and a memory system.

A semiconductor memory device is a memory device which is fabricated using semiconductors such as silicon (Si), germanium (Ge), gallium arsenide (GaAs), indium phosphide (InP), and so on. Semiconductor memory devices are classified into volatile memory devices and nonvolatile memory devices.

Volatile memory devices may lose stored contents at power-off. Volatile memory devices include a static RAM (SRAM), a dynamic RAM (DRAM), a synchronous DRAM (SDRAM), and the like. Nonvolatile memory devices may retain stored contents even at power-off. Nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

SUMMARY

One aspect of some example embodiments of the inventive concepts is directed to providing a memory module which includes a printed circuit board; first semiconductor packages provided on one surface of the printed circuit board; and second semiconductor packages provided on the other surface of the printed circuit board, wherein the first semiconductor packages and the second semiconductor packages have semiconductor dies that form ranks, a number of the ranks formed by the first semiconductor packages being different from a number of the ranks formed by the second semiconductor packages, and the semiconductor dies in a same rank receive a chip selection signal in common and the semiconductor dies in different ranks receive different chip selection signals.

In one example embodiment, the first semiconductor packages form two ranks and the second semiconductor packages form a single rank.

In one example embodiment, the first semiconductor packages are dual die packages and the second semiconductor packages are mono die packages.

In one example embodiment, the semiconductor dies at a first layer of the first semiconductor packages form a rank and the semiconductor dies at a second layer of the first semiconductor packages form another rank.

In one example embodiment, the first and second semiconductor packages have different structures.

In one example embodiment, a number of semiconductor dies provided at each of the first semiconductor packages is different from a number of semiconductor dies provided at each of the second semiconductor packages.

Another aspect of some example embodiments of the inventive concepts is directed to providing a memory module which includes a plurality of semiconductor dies connected with an external device through a common channel, the plurality of semiconductor dies configured to operate in response to control signals from the external device, wherein the plurality of semiconductor dies form ranks a number of which is not a power of 2, and wherein semiconductor dies in a same rank receive a chip selection signal in common and semiconductor dies in different ranks receive different chip selection signals.

In one example embodiment, the number of ranks formed by the plurality of semiconductor dies corresponds to one of 3, 5, 6, and 7.

In one example embodiment, the memory module further comprises a printed circuit board having a first surface and a second surface. First semiconductor dies of the plurality of semiconductor dies are provided on the first surface, second semiconductor dies of the plurality of semiconductor dies are provided on the second surface. A first number of ranks in the first semiconductor dies is different from a second number of ranks in the second semiconductor dies.

In one example embodiment, the first semiconductor dies are dual die packages provided on the first surface of the printed circuit board and the second semiconductor dies are mono die packages provided on the second surface of the printed circuit board.

Still another aspect of some example embodiments of the inventive concepts is directed to providing a memory system which includes a memory controller; and a plurality of first semiconductor dies connected with the memory controller through a common channel and configured to operate in response to control signals of the memory controller, wherein the plurality of first semiconductor dies form ranks a number of which is not a power of 2, and semiconductor dies in a same rank receive a chip selection signal in common and semiconductor dies in different ranks receive different chip selection signals.

In one example embodiment, the plurality of first semiconductor dies are packed together with the memory controller to form a multi-chip package.

In one example embodiment, the memory controller forms a first package, the plurality of first semiconductor dies form at least one second package, and the first package and the at least one second package form a package-on-package.

In one example embodiment, the memory system further includes a plurality of second semiconductor dies connected with the memory controller through a second common channel and configured to operate in response to control signals from the memory controller.

In one example embodiment, the plurality of first semiconductor dies and the plurality of second semiconductor dies are packed together with the memory controller to form a multi-chip package.

In one example embodiment, the memory controller forms a first package, the plurality of first semiconductor dies and the plurality of second semiconductor dies form at least one second package, and the first package and the at least one second package form a package-on-package.

Still another aspect of some example embodiments is directed to a memory module.

In one or more example embodiments, the memory module includes sets of semiconductor dies arranged in ranks on a printed circuit board, each set of semiconductor dies in a same rank configured to communicate with a controller over a common channel and a number of the ranks arranged on the printed circuit board not being a power of two.

In one example embodiment, the number of the ranks arranged on the printed circuit board corresponds to one of three, five, six, and seven.

In one example embodiment, the memory module is configured to communicate with a memory controller at an operating speeds of up to 1600 megabits per second (Mpbs).

In one example embodiment, the sets of semiconductor dies are packed together with a memory controller to form a multi-chip package.

With example embodiments of the inventive concepts, the number of ranks connected with one channel may be adjusted. Thus, an operating speed supported by semiconductor memories may be optimized. Also, it is possible to provide a memory module and a memory system with the improved operating speed.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 2 is a table illustrating operating speeds of a memory unit according to the number of ranks;

DETAILED DESCRIPTION

Figure 1:
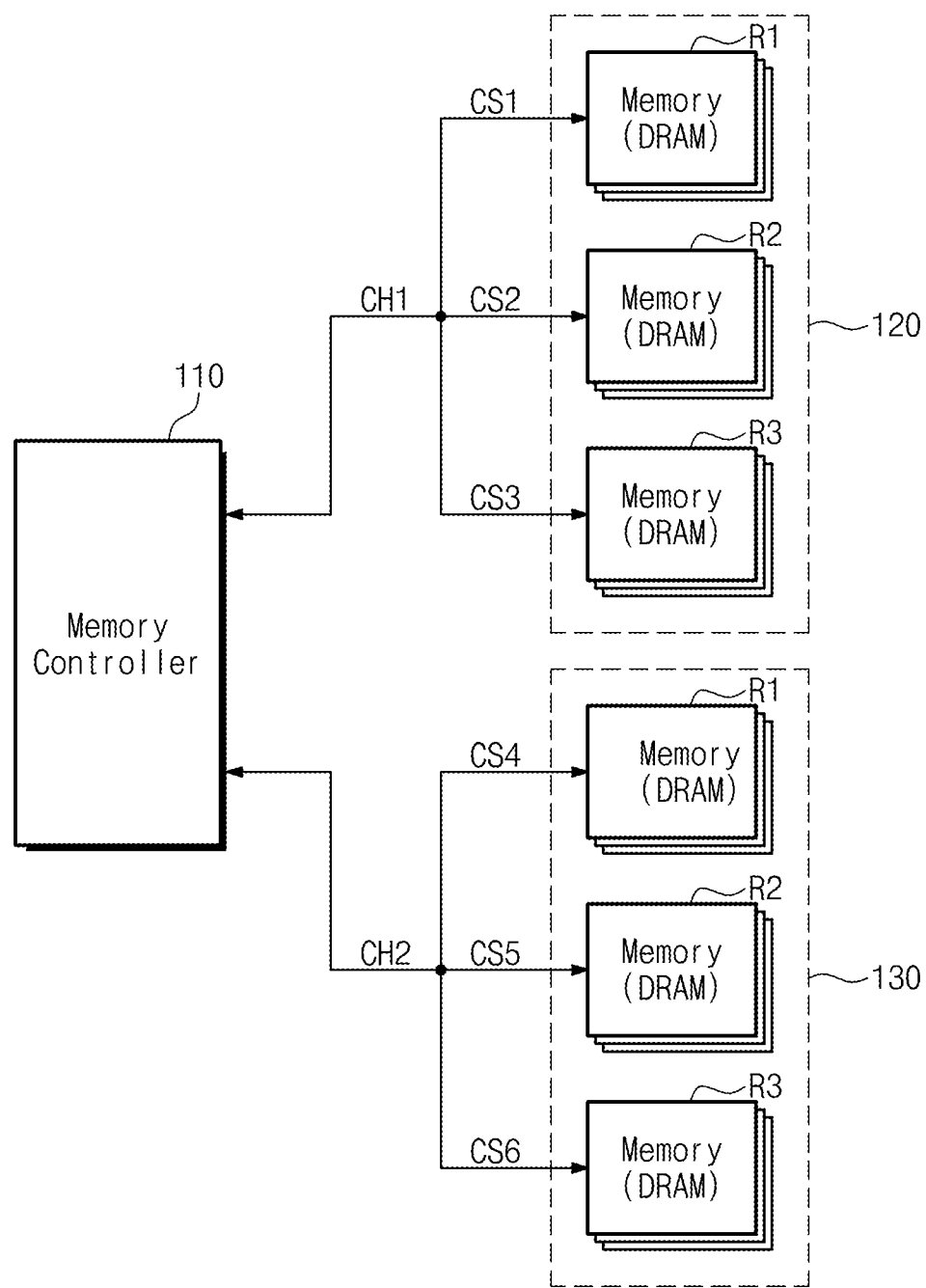
FIG. 1 is a block diagram schematically illustrating a memory system according to an example embodiment of the inventive concepts.

Example embodiments will be described in detail with reference to the accompanying drawings. Embodiments, however, may be embodied in various different forms, and should not be construed as being limited only to the illustrated example embodiments. Rather, these example embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system 100 according to an example embodiment of the inventive concepts.

Referring to FIG. 1, a memory system 100 may include a memory controller 110, a first memory unit 120, and a second memory unit 130.

The memory controller 110 may be configured to control the first and second memory units 120 and 130.

The first memory unit 120 may be configured to communicate with the memory controller 110 through a first channel CH1. The first memory unit 120 may perform operations (e.g., a read operation, a write operation, etc.) according to a control of the memory controller 110.

The first memory unit 120 may include a plurality of ranks R1 to R3, each of which includes one or more memory chips (or, memory dies). For example, each rank may include one or more DRAM memory chips (or, memory dies).

The ranks R1 to R3 may receive different chip selection signals CS1, CS2, and CS3 from the memory controller 110 through the first channel CH1. For example, the first rank R1 may receive the first chip selection signal CS1 from the memory controller 110 through the first channel CH1. When the first chip selection signal CS1 is activated, memory chips (or, memory dies) in the first rank R1 may be activated. The second rank R2 may receive the second chip selection signal CS2 from the memory controller 110 through the first channel CH1. The third rank R3 may receive the third chip selection signal CS3 from the memory controller 110 through the first channel CH1. That is, in the first channel CH1, the chip selection signals CS1 to CS3 associated with the first to third ranks R1 to R3 may be transferred through lines which are electrically separated.

It is possible to exchange data in common with the memory controller 110 through the ranks R1 to R3. For example, when the first chip selection signal CS1 is activated, the first rank R1 may receive data transmitted from the memory controller 110 through the first channel CH1 or send data to the first channel CH1. When the second chip selection signal CS2 is activated, the second rank R2 may receive data transmitted from the memory controller 110 through the first channel CH1 or send data to the first channel CH1. When the third chip selection signal CS3 is activated, the third rank R3 may receive data transmitted from the memory controller 110 through the first channel CH1 or send data to the first channel CH1. That is, in the first channel CH1, data associated with the first to third ranks R1 to R3 may be transferred through common data lines.

In each rank, memory chips (or, memory dies) may share a chip selection signal. For example, when the first chip selection signal CS1 is activated, memory chips (or, memory dies) of the first rank R1 may be activated at the same time.

In each rank, memory chips (or, memory dies) may exchange data through the first channel CH1 independently. For example, data lines of the first channel CH1 may be divided into groups corresponding to memory chips (or, memory dies) in each rank, respectively. Each group may be assigned to each memory chip (or, each memory die) in each rank. For example, the first channel CH1 may have 64 data lines, each rank may be formed of eight memory chips (or, memory dies), and each memory chip (or, each memory die) may have an 8-bit data channel.

The second memory unit 130 may have the same structure as the first memory unit 120 except that the second memory unit 130 communicates with the memory controller 110 through the second channel CH2 and receives fourth to sixth chip selection signals CS4 to CS6, and a description thereof is thus omitted for the sake of brevity.

The memory unit 120 and the memory unit 130 may communicate with the memory controller 110 through channel CH1 or channel CH2, respectively. Each of the memory units 120/130 may include a plurality of ranks R1 to R3. Each rank may include a plurality of memory chips (or, memory dies). The plurality of ranks R1 to R3 communicate with the memory controller 110 via a plurality of chip selection signals CS1 to CS3, respectively.

The number of ranks connected with a channel CH1 or channel CH2 may not be a power of 2 (e.g. $2^n$, where n is a positive integer). For example, the number of ranks connected with one channel CH1 or CH2 may be one of 3, 5, 6, 7, 9, 10, etc., but not 1, 2, 4, 8 etc.

In example embodiments, memory chips (or, memory dies) may be random access memories such as a DRAM, SRAM, PRAM, MRAM, FRAM, RRAM, and so on. The first and second memory units 120 and 130 may be used as a main memory in a computing device.

In example embodiments, each of the first and second memory units 120 and 130 may be a memory module. For example, each of the first and second memory units 120 and 130 may be one of memory modules such as DIMM (Dual In-line Memory Module), RDIMM (Registered DIMM), FBDIMM (Fully Buffered DIMM), and so on.

FIG. 2 is a table illustrating operating speeds of a memory unit according to the number of ranks. Referring to FIGS. 1 and 2, when one memory unit (e.g., a memory module) includes one rank, it may support 1066 megabits per second (Mbps), 1333 Mbps, and 1600 Mbps.

When one memory unit (e.g., a memory module) includes two ranks, it may support 1066 Mbps, 1333 Mbps, and 1600 Mbps.

When one memory unit (e.g., a memory module) includes four ranks, it may support 1066 Mbps, while it may not support 1333 Mbps and 1600 Mbps.

Ranks connected with a channel CH1 or CH2 may act as a load. As the number of ranks connected with a channel CH1 or CH2 increases, a load of the channel CH1 or CH2 may increase. In this case, an operating speed (e.g., a clock frequency) supported at the channel CH1 or CH2 may decrease.

In a typical memory system, one channel CH1 or CH2 may be connected with ranks the number of which corresponds to a power of 2. For example, one memory module (DIMM, RDIMM, or FBDIMM) may provide ranks the number of which corresponds to a power of 2. As illustrated in FIG. 2, in the case that there are provided ranks the number of which corresponds to a power of 2, an operating speed may gradually decrease according to an increase in the number of ranks. Thus, in the case that there are provided ranks the number of which corresponds to a power of 2, optimization on the capacity and operating speed of a memory unit 120 or 130 connected with one channel may not be performed normally.

For example, in the case that the capacity of a memory unit 120 or 130 connected with one channel CH1 or CH2 increases, the number of ranks of the memory unit 120 or 130 may increase. In the case that the operating speed of the memory unit 120 or 130 increases, the number of ranks of the memory unit 120 or 130 may decrease. With the above description, the number of ranks may be adjusted to optimize the capacity and operating speed of the memory unit 120 or 130.

Referring to FIG. 2, if there are provided ranks the number of which corresponds to a power of 2, it may be difficult to provide a memory unit 120 or 130 having an operating speed of 1333 Mbps. That is, although a processor accessing a memory system 100 supports an operating speed of 1333 Mbps, it may access the memory system 10 in an operating speed of only 1066 Mbps.

To solve the above-described problem, a memory unit (or, a memory module) according to an example embodiment of the inventive concepts may be configured to provide ranks the number of which corresponds to a number not being a power of 2 (e.g., 3. 5, 6, 7, 9, 10, etc.).

Figures 3, 4:
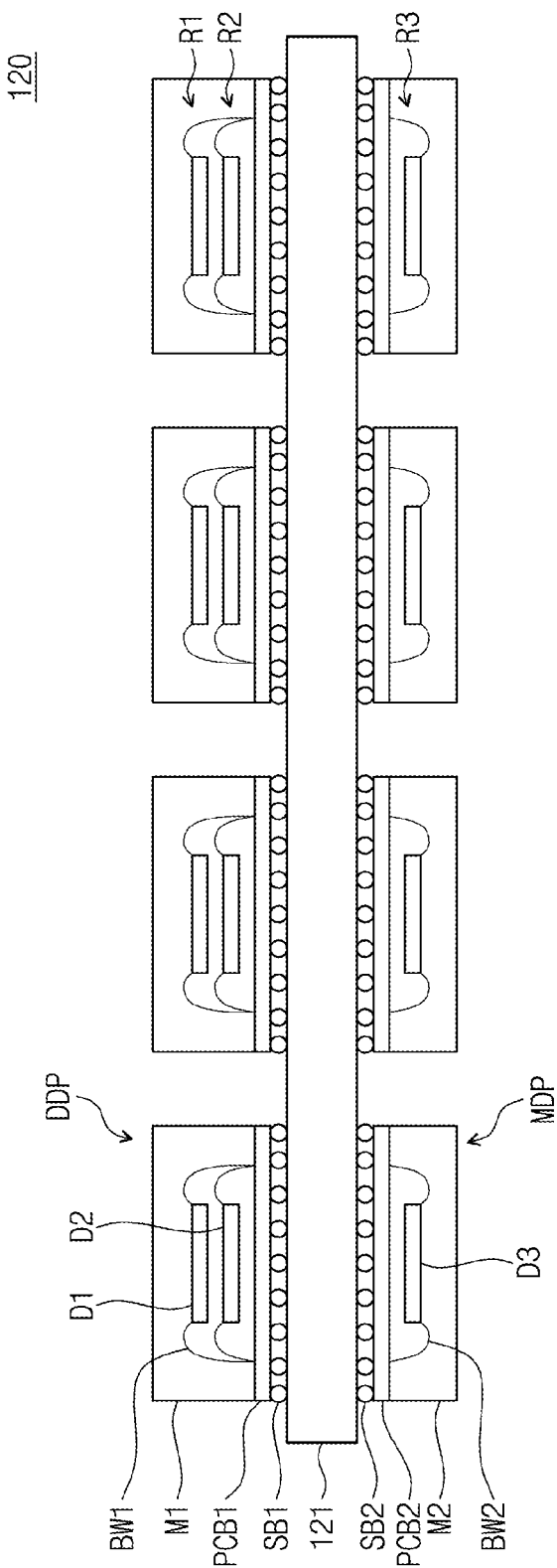
FIG. 3 is a table illustrating a relationship between channels and ranks.
FIG. 4 is a diagram schematically illustrating a memory module according to an example embodiment of the inventive concepts.

FIG. 3 is a table illustrating relationships between channels and ranks according to first and second cases. The first case shows an example in which the number of ranks provided corresponds to power of two and the second case shows an example in which the number of ranks provided does not correspond to a power of two. It is assumed that a memory capacity achieved through an organization of channels and ranks is 48 GB. It is assumed that a capacity of memory chips (or, memory dies) in a rank is 8 GB.

Referring to FIGS. 1 to 3, in the first case, two ranks may be provided at the first channel CH1 and four ranks may be provided at the second channel CH2. In the first case, memory chips (or, memory dies) within the ranks that are connected with the first and second channels CH1 and CH2 may support 1066 Mbps.

In the second case, three ranks may be provided at the first channel CH1 and three ranks may be provided at the second channel CH2. In the second case, memory chips (or, memory dies) within the ranks that are connected with the first and second channels CH1 and CH2 may support 1033 Mbps.

As shown in FIG. 3, in case 2 where the number of ranks provided at the channels CH1 and CH2 may not be a power of 2, the memory chips (or, memory dies) may be optimized to run at higher operating speeds that are supported by the memory chips (or, memory dies).

FIG. 4 is a diagram schematically illustrating the memory unit (or memory module) 120 according to an example embodiment of the inventive concepts. In example embodiments, the memory module 120 may be a DIMM, an RDIMM, or an FBDIMM.

Referring to FIG. 4, the memory module 120 may include a printed circuit board 121, a plurality of dual die packages (DDPs), and a plurality of mono die packages (MDPs).

The dual die packages may be provided on one surface of the printed circuit board 121. Each of the dual die packages may provide two ranks R1 and R2. The mono die packages may be provided on the other surface of the printed circuit board 121. Each of the mono die packages may provide a rank R3.

Each of the dual die packages may include a printed circuit board PCB1, memory dies D1 and D2, bonding wires BW1 and a molding M1. The memory dies D1 and D2 may be stacked on the printed circuit board PCB1. The memory dies D1 and D2 may be connected with the printed circuit board PCB1 through the bonding wires BW1. The molding M1 may surround and protect the printed circuit board PCB1, the memory dies D1 and D2, and the bonding wires BW1. Solder balls SB1 may be electrically connected with the memory dies D1 and D2 through the printed circuit board PCB1 and the bonding wires BW1. The solder balls SB1 may be electrically connected with the printed circuit board 121.

In the dual die packages, the memory dies D1, placed at one layer, from among the memory dies D1 and D2 may form the rank R1, and the memory dies D2, placed at the other layer, from among the memory dies D1 and D2 may form the rank R2.

Each of the mono die packages may include a printed circuit board PCB2, a memory die D3, bonding wires BW2 and a molding M2. The memory die D3 may be stacked on the printed circuit board PCB2. The memory die D3 may be connected with the printed circuit board PCB2 through the bonding wires BW2. The molding M2 may surround and protect the printed circuit board PCB2, the memory die D3, and the bonding wires BW2. Solder balls SB2 may be electrically connected with the memory die D3 through the printed circuit board PCB2 and the bonding wires BW2. The solder balls SB2 may be electrically connected with the printed circuit board 121.

The memory dies D3 of the mono die packages may constitute the rank R3.

As described above, the memory module 120 may be configured to include different types of memory packages (e.g., DDP and MDP), so that it is formed to include ranks the number of which is not a power of 2.

In FIG. 4, there are illustrated dual die packages and mono die packages. However, the inventive concepts are not limited thereto. While it is appropriate to form the dual die packages to include two memory dies D1 and D2, modification and application on a detailed structure (e.g., location, a connection method, etc.) may be made using a well-known packaging method and packaging methods to be developed later. Likewise, while it is appropriate to form the mono die packages to include a memory die D3, modification and application on a detailed structure (e.g., location, a connection method, etc.) may be made using a well-known packaging method and packaging methods to be developed later. This may be applied to example embodiments to be described later.

Figures 5, 6:
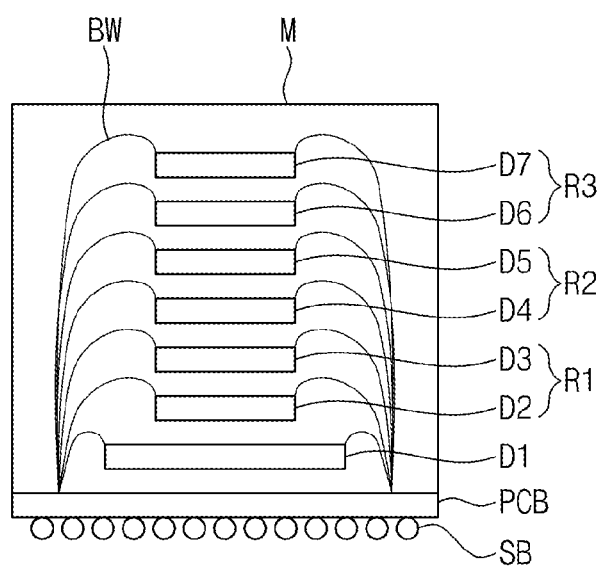
FIG. 5 is a table illustrating memory modules according to example embodiments of the inventive concepts.
FIG. 6 is a diagram schematically illustrating a memory system according to another example embodiment of the inventive concepts.

FIG. 5 is a table illustrating memory modules according to example embodiments of the inventive concepts.

Referring to FIG. 5, when the number of ranks is 3, a package including two dies stacked may be provided on one surface of the memory module 120 or 130. In each package having two dies, one die may form the rank R1 and the other die may form the rank R2. A package including one die may be provided on the other surface of the memory module. In each package having one die, the one die may form the rank R3. Example embodiment having this configuration may correspond to the memory module 120 illustrated in FIG. 4.

When the number of ranks is 5, a package including three dies stacked may be provided on one surface of a memory module. In each package having three dies, a first die may form a first rank, a second die may form a second rank, and a third die may form a third rank. A package including two dies stacked may be provided on the other surface of the memory module. In each package having two dies, one die may form a rank and the other die may form the other rank.

When the number of ranks is 6, a package including three dies stacked may be provided on one surface of a memory module. In each package having three dies, a first die may form a first rank, a second die may form a second rank, and a third die may form a third rank. A package including three dies stacked may be provided on the other surface of the memory module. In each package having three dies, a first die may form a first rank, a second die may form a second rank, and a third die may form a third rank.

When the number of ranks is 7, a package including four dies stacked may be provided on one surface of a memory module. In each package having four dies, a first die may form a first rank, a second die may form a second rank, a third die may form a third rank, and a fourth die may form a fourth rank. A package including three dies stacked may be provided on the other surface of the memory module. In each package having three dies, a first die may form a first rank, a second die may form a second rank, and a third die may form a third rank.

FIG. 6 is a diagram schematically illustrating a memory system 100a according to another example embodiment of the inventive concepts.

Referring to FIG. 6, a memory system 100a may include first to seventh dies D1 to D7.

The first die D1 may be a memory controller. The second to seventh dies D2 to D7 may be memory dies. The first to seventh dies D1 to D7 may be electrically connected with a printed circuit board PCB through bonding wires BW. Solder balls SB may be electrically connected with the first to seventh dies D1 to D7 through the printed circuit board PCB and the bonding wires BW. The first to seventh dies D1 to D7, the bonding wires BW, and the printed circuit board PCB may be protected by a molding M.

The first to seventh dies D1 to D7 may form a multi-chip package (MCP) including different types of dies (or, chips).

The second to seventh dies D2 to D7 may communicate with the first die D1 through one channel. The second to seventh dies D2 to D7 may form ranks the number of which is not a power of 2. For example, the second and third dies D2 and D3 may form a first rank R1, the fourth and fifth dies D4 and D5 may form a second rank R2, and the sixth and seventh dies D6 and D7 may form a third rank R3.

If ranks the number of which is not a power of 2 are provided, it is possible to optimize the operating speed and capacity of the memory system 100a formed of the multi-chip package.

Figure 7:
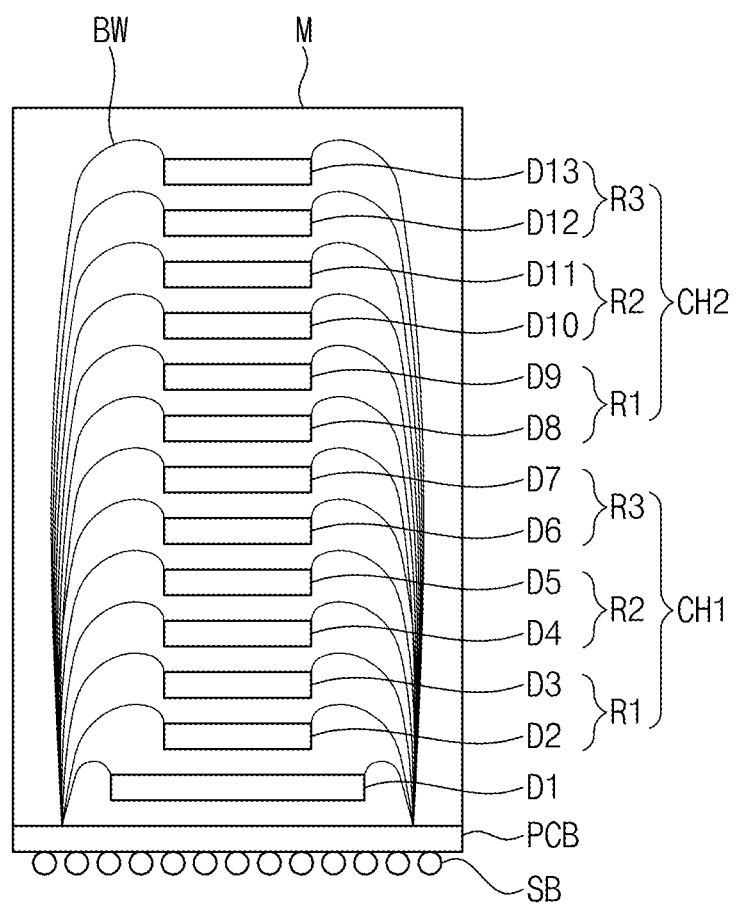
FIG. 7 is a diagram schematically illustrating a memory system according to still another example embodiment of the inventive concepts.

FIG. 7 is a diagram schematically illustrating a memory system 100b according to still another example embodiment of the inventive concepts.

Referring to FIG. 7, a memory system 100b may include $1^{st}$ to $13^{th}$ dies D1 to D13.

The memory system 100b may have the same structure as a memory system 100a of FIG. 6 except that the number of memory dies increases and the memory dies communicate with a memory controller through a plurality of channels, and a description thereof is thus omitted for the sake of brevity.

The $1^{st}$ die D1 may be a memory controller, and the $2^{nd}$ to $13^{th}$ dies D2 to D13 may be memory dies. The $2^{nd}$ to $7^{th}$ dies D2 to D7 may communicate with the $1^{st}$ die D1 through a first channel CH1, and the $8^{th}$ to $13^{th}$ dies D8 to D13 may communicate with the $1^{st}$ die D1 through a second channel CH2.

Memory dies connected with each channel may form ranks the number of which is not a power of 2. For example, in the first channel CH1, the $2^{nd}$ and $3^{rd}$ dies D2 and D3 may form a first rank R1, the $4^{th}$ and $5^{th}$ dies D4 and D5 may form a second rank R2, and the $6^{th}$ and $7^{th}$ dies D6 and D7 may form a third rank R3. In the second channel CH2, the $8^{th}$ and $9^{th}$ dies D8 and D9 may form a first rank R1, the $10^{th}$ and $11^{th}$ dies D10 and D11 may form a second rank R2, and the $12^{th}$ and $13^{th}$ dies D12 and D13 may form a third rank R3.

If ranks the number of which is not a power of 2 are provided, it is possible to optimize the operating speed and capacity of the memory system 100b formed of a multi-chip package.

Figure 8:
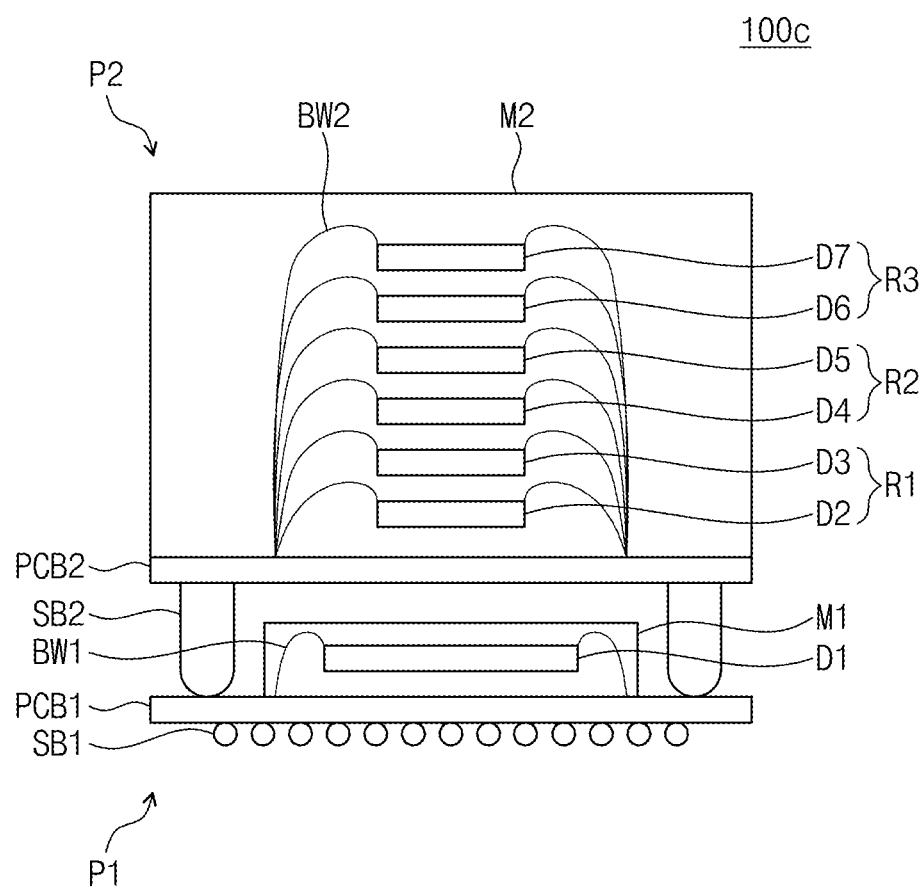
FIG. 8 is a diagram schematically illustrating a memory system according to still another example embodiment of the inventive concepts.

FIG. 8 is a diagram schematically illustrating a memory system 100c according to still another example embodiment of the inventive concepts.

Referring to FIG. 8, a memory system 100c may include a first package P1 and a second package P2.

The first package P1 may be a logic package. The first package P1 may be a memory controller. The first package P1 may include a printed circuit board PCB1, a die D1 provided on the printed circuit board PCB1, bonding wires BW1 connecting the printed circuit board PCB1 and the die D1, a molding M1 protecting the die D1 and the bonding wires BW1, and solder balls SB1.

The second package P2 may be a memory package. The second package P2 may include a printed circuit board PCB2, a plurality of dies D2 to D7 stacked on the printed circuit board PCB2, bonding wires BW2 connecting the printed circuit board PCB2 and the dies D2 to D7, a molding M2 protecting the dies D2 to D7 and the bonding wires BW2, and solder balls SB2. The solder balls SB2 may be connected with the printed circuit board PCB1 of the first package P1. The solder balls SB1 of the first package P1 may be electrically connected with the die D1 of the first package P1 and the dies D2 to D7 of the second package P2.

The first and second packages P1 and P2 may constitute a package-on-package (PoP).

The dies D2 and D7 in the second package P2 may form ranks the number of which is not a power of 2. For example, the $2^{nd}$ and $3^{rd}$ dies D2 and D3 may form a first rank R1, the $4^{th}$ and $5^{th}$ dies D4 and D5 may form a second rank R2, and the $6^{th}$ and $7^{th}$ ranks D6 and D7 may form a third rank R3.

If ranks the number of which is not a power of 2 are provided, it is possible to optimize the operating speed and capacity of the memory system 100c formed of the package-on-package.

Figure 9:
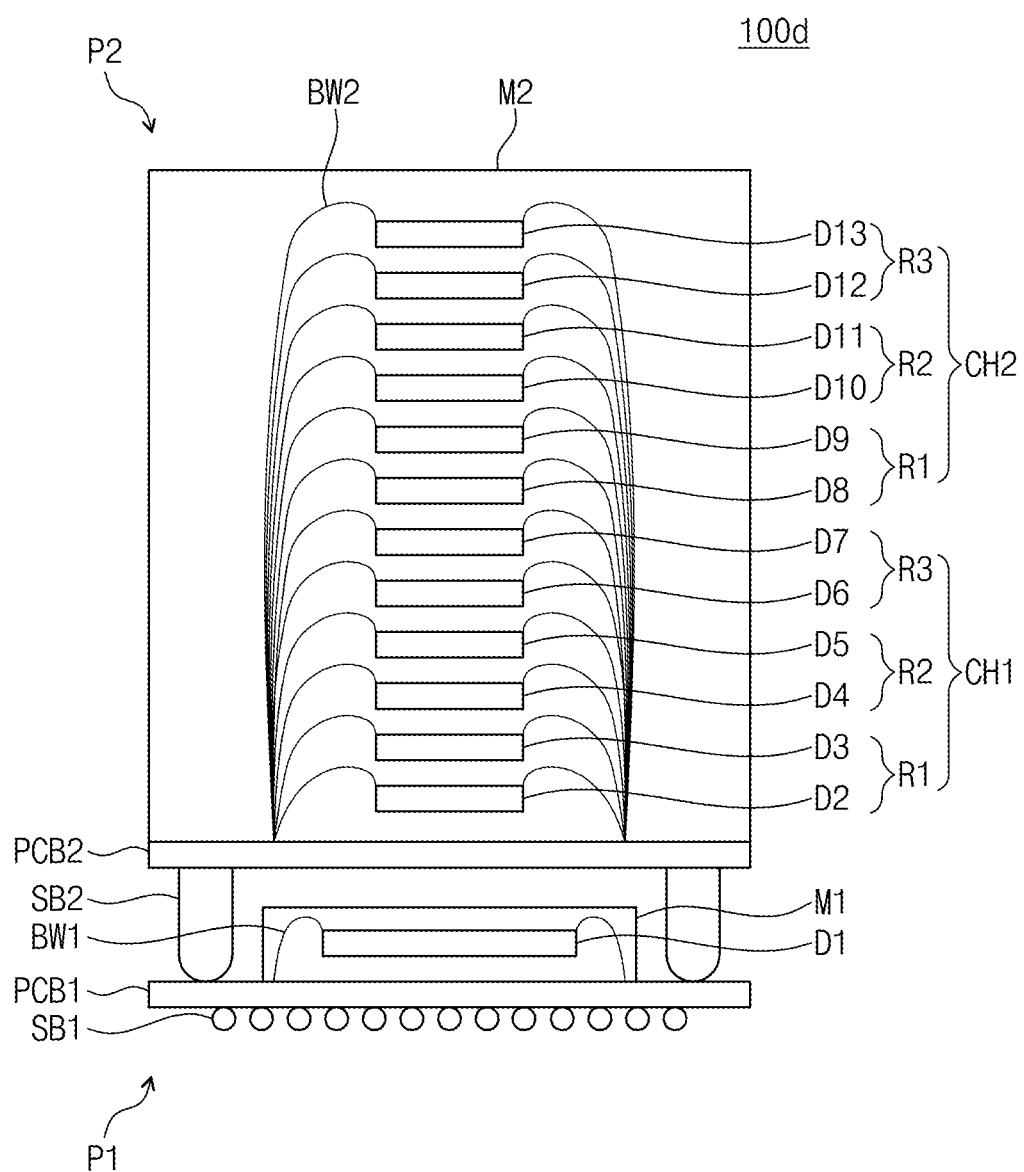
FIG. 9 is a diagram schematically illustrating a memory system according to still another example embodiment of the inventive concepts.

FIG. 9 is a diagram schematically illustrating a memory system 100d according to still another example embodiment of the inventive concepts.

Referring to FIG. 9, a memory system 100d may include a first package P1 and a second package P2.

The memory system 100d may have the same structure as a memory system 100c of FIG. 8 except that the number of memory dies of the second package P2 increases and the memory dies communicate with a memory controller of the first package 1 through a plurality of channels, and a description thereof is thus omitted for the sake of brevity.

The first package P1 may include a plurality of dies D2 to D13. The $2^{nd}$ to $7^{th}$ dies D2 to D7 may communicate with the first package P1 through a first channel CH1, and the $8^{th}$ to $13^{th}$ dies D8 to D13 may communicate with the first package P1 through a second channel CH2.

Memory dies connected with each channel may form ranks the number of which is not a power of 2. For example, in the first channel CH1, the $2^{nd}$ and $3^{rd}$ dies D2 and D3 may form a first rank R1, the $4^{th}$ and $5^{th}$ dies D4 and D5 may form a second rank R2, and the $6^{th}$ and $7^{th}$ dies D6 and D7 may form a third rank R3. In the second channel CH2, the $8^{th}$ and $9^{th}$ dies D8 and D9 may form a first rank R1, the $10^{th}$ and $11^{th}$ dies D10 and D11 may form a second rank R2, and the $12^{th}$ and $13^{th}$ dies D12 and D13 may form a third rank R3.

If ranks the number of which is not a power of 2 are provided, it is possible to optimize the operating speed and capacity of the memory system 100d formed of a package-on-package.

Figure 10:
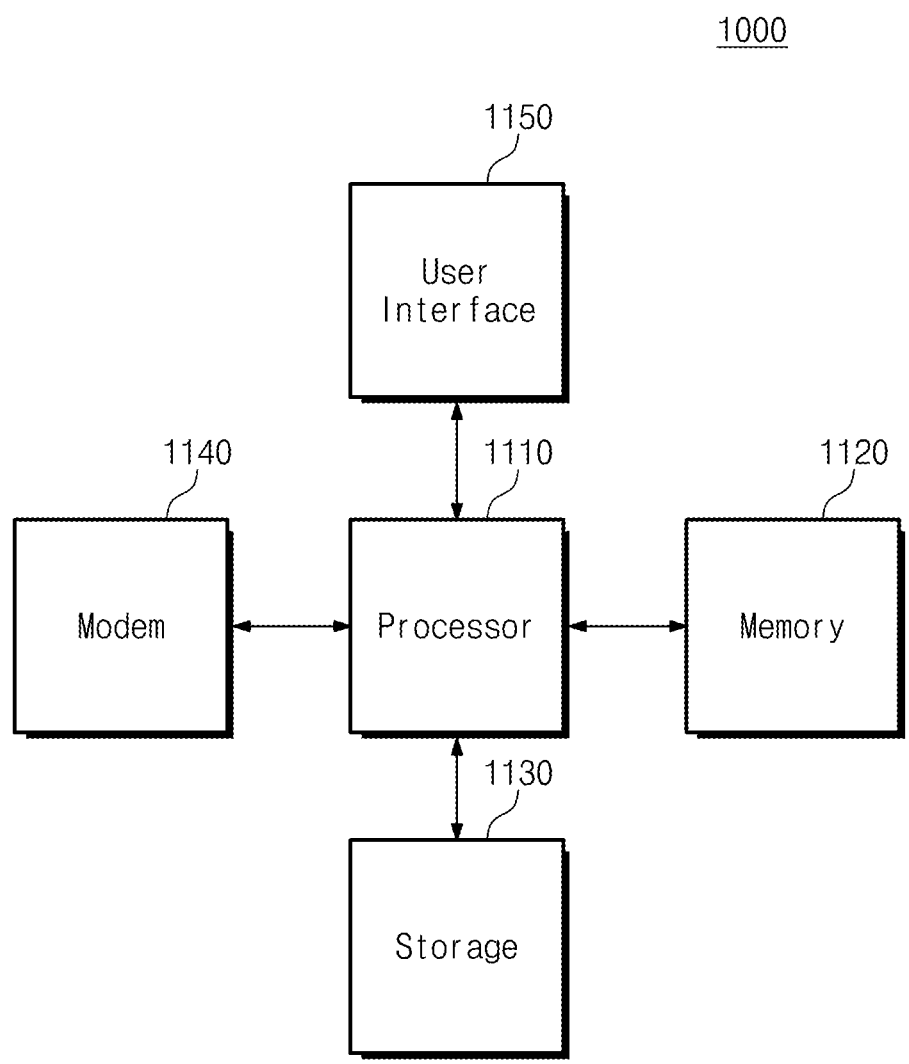
FIG. 10 is a block diagram schematically illustrating a computing device according to an example embodiment of the inventive concepts.

FIG. 10 is a block diagram schematically illustrating a computing device 1000 according to an example embodiment of the inventive concepts.

Referring to FIG. 10, a computing device 1000 may include a processor 1110, a memory 1120, storage 1130, a modem 1140, and a user interface 1150.

The processor 1110 may control an overall operation of the computing device 1000, and may perform logical operations. The processor 1110 may be formed of a system-on-chip (SoC).

The memory 1120 may communicate with the processor 1110. The memory 1120 may be a working memory (or, a main memory) of the processor 1110 or the computing device 1000. The memory 1120 may include a volatile memory such as a static RAM, a dynamic RAM, a synchronous DRAM, or the like or a nonvolatile memory such as a flash memory, a phase-change RAM, a magnetic RAM, a resistive RAM, a ferroelectric RAM, or the like.

As described with reference to FIGS. 1 to 9, the memory 1120 may provide ranks the number of which is not a power of 2 per channel. Thus, it is possible to optimize the operating speed and capacity of the computing device 1000 including the memory 1120 and the processor 1110 communicating with the memory 1120.

The storage 1130 may store data which the computing device 1000 retains for a long time. The storage 1130 may include a hard disk drive or a nonvolatile memory such as a flash memory, a phase-change RAM, a magnetic RAM, a resistive RAM, a ferroelectric RAM, or the like.

In example embodiments, the memory 1120 and the storage 1130 may be formed of the same type of nonvolatile memories. In this case, the memory 1120 and the storage 1130 may be integrated to a semiconductor integrated circuit.

The modem 1140 may communicate with an external device according to a control of the processor 1110. For example, the modem 1140 may communicate with the external device in a wire or wireless manner. The modem 1140 may communicate based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), SCSI (Small Computer Small Interface), Firewire, PCI (Peripheral Component Interconnection), and so on.

The user interface 1150 may communicate with a user according to a control of the processor 1110. For example, the user interface 1150 may include user input interfaces such as a keyboard, a keypad, a button, a touch panel, a touch screen, a touch pad, a touch ball, a camera, a microphone, a gyroscope sensor, a vibration sensor, and so on. The user interface 1150 may further include user output interfaces such as an LCD, an OLED (Organic Light Emitting Diode) display device, an AMOLED (Active Matrix OLED) display device, an LED, a speaker, a motor, and so on.

The computing device 1000 may include a variety of devices such as a computer, a notebook computer, a server, a smart television, and so on. The computing device 1000 may include a variety of mobile devices a smart phone, a smart pad, a smart camera, and so on.

Figure 11:
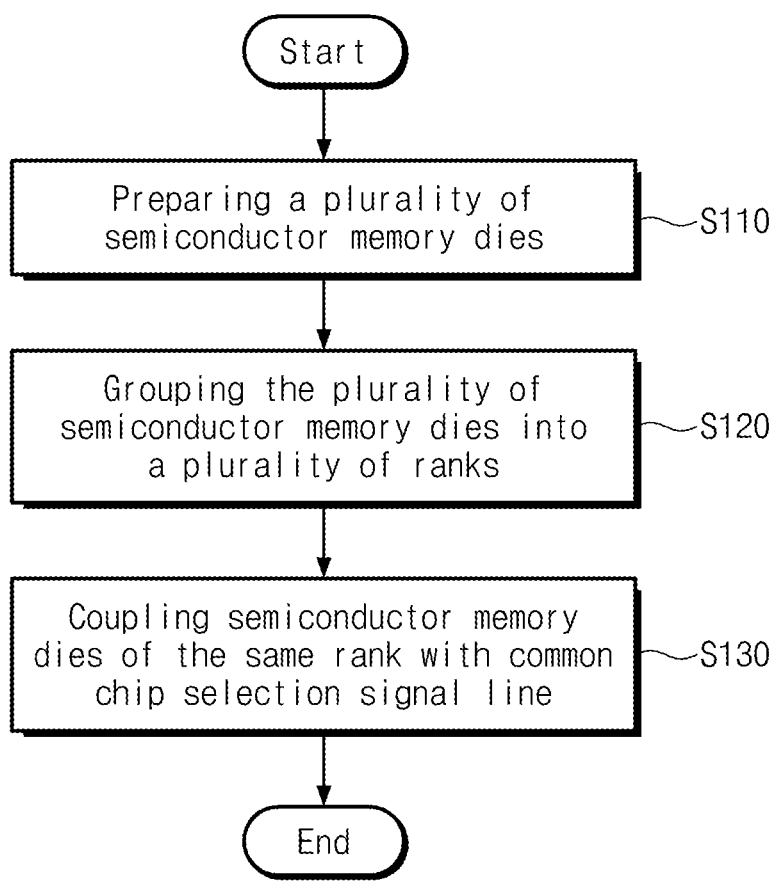
FIG. 11 is a flow chart schematically illustrating a semiconductor memory fabricating method according to an example embodiment of the inventive concepts.

FIG. 11 is a flow chart schematically illustrating a semiconductor memory fabricating method according to an example embodiment of the inventive concepts. In example embodiments, the fabricating method of FIG. 11 may be a memory module fabricating method. However, the inventive concepts are not limited thereto.

Referring to FIG. 11, in operation S110, a plurality of semiconductor memory dies may be prepared.

In operation S120, the semiconductor memory dies may be grouped into a plurality of ranks. In this case, the semiconductor memory dies may be grouped into ranks the number of which is not a power of 2.

In operation S130, semiconductor memory dies in the same rank may be connected with a common chip selection signal. Also, a plurality of ranks may be connected in common with the same data lines. Data lines connected with each rank may be distributed and connected to semiconductor memory dies in a corresponding rank.

In example embodiments, if packaging is performed before operation S120, a memory module described with reference to FIG. 4 may be fabricated. Alternatively, if packaging is performed after operation S130, a memory system having a multi-chip package as described with reference to FIG. 6 or 7 or a memory system having a package-on-package design described with reference to FIG. 8 or 9 may be fabricated.

While the inventive concepts have been described with reference to example embodiments, it will be apparent to those skilled in the art that various changes and modifications may be made without departing from the spirit and scope of the present invention. Therefore, it should be understood that the above example embodiments are not limiting, but illustrative.

What is claimed is:

1. A computing system comprising:
a processor; and
sets of semiconductor dies arranged in ranks on a printed circuit board, each of the sets of semiconductor dies in a same rank configured to communicate with the processor over a common channel, a number of the ranks arranged on the printed circuit board not being a power of two and the number of the ranks corresponding to one of three, five, six, and seven.

2. The computing system of claim 1, wherein the computing system further comprises:
a storage device; and
a user interface.

3. The computing system of claim 2, wherein the user interface includes one or more of an input device and an output device.

4. The computing system of claim 3, wherein the input device is one of a keyboard, a keypad, a button, a touch panel, a touch screen, a touch pad, a touch ball, a camera, a microphone, a gyroscope sensor, and a vibration sensor.

5. The computing system of claim 3, wherein the output device is one of an LCD, an Organic Light Emitting Diode (OLED) display device, an Active Matrix OLED (AMOLED) display device, an LED, a speaker, and a motor.

6. The computing system of claim 2, wherein the storage device is one of a hard disk drive and a nonvolatile memory.

7. The computing system of claim 2, wherein a type of the nonvolatile memory is one of a flash memory, a phase-change random access memory (RAM), a magnetic RAM, a resistive RAM, and a ferroelectric RAM, and
a memory of the semiconductor dies and the storage device are a same one of the type of the nonvolatile memories.

8. The computing system of claim 7, wherein the memory of the semiconductor dies and the storage device are integrated into a semiconductor integrated circuit.

9. The computing system of claim 2, further comprising:
a modem configured to communicate with an external device according to a control of the processor.

10. The computing system of claim 9, wherein the modem is configured to communicate based on at least one of wireless communication protocol and a wired communication protocol,
the wireless communication protocol including Long Term Evolution (LTE), WiMax, Global System for Mobile communication (GSM), Code Division Multiple Access (CDMA), Bluetooth, Near Field Communication (NFC), WiFi, and Radio Frequency Identification (RFID), and
the wired communication protocol including Universal Serial Bus (USB), Serial AT Attachment (SATA), Small Computer Small Interface (SCSI), Firewire, and Peripheral Component Interconnection (PCI).

11. The computing system of claim 1, wherein the computing system is one of a personal computer, a notebook computer, a server, and a smart television.

12. The computing system of claim 1 wherein the computing system is a mobile device, the mobile device being one of a smart phone, a smart pad, and a smart camera.

13. A computing system comprising:
a controller; and
sets of semiconductor dies arranged in ranks on a printed circuit board, each of the sets of semiconductor dies in a same rank configured to communicate with the controller over a common channel and a number of the ranks arranged on the printed circuit board not being a power of two, and the number of the ranks arranged on the printed circuit board corresponding to one of three, five, six, and seven.

14. The computing system of claim 13, wherein the computing system is one of stationary computing device and a mobile computing device,
the statutory computing device is one of a personal computer, a notebook computer, a server, and a smart television, and
the mobile device is one of a smart phone, a smart pad, a smart camera.

15. A computing system comprising:
a processor; and
a memory module including,
a printed circuit board, and
first semiconductor packages and second semiconductor packages on a first surface and a second surface of the printed circuit board, respectively, the first semiconductor package and the second semiconductor package each including semiconductor dies configured to communicate with the processor, the semiconductor dies being in ranks such that a number of the ranks associated with the first semiconductor package is different from a number of the ranks associated with the second semiconductor package, wherein
the semiconductor dies in a same one of the ranks are configured to receive a chip selection signal in common and the semiconductor dies in different ones of the ranks are configured to receive different chip selection signals.

16. The computing system of claim 15, wherein the number of the ranks associated with the first semiconductor package is two, and the number of the ranks associated with the second semiconductor package is one.

17. The computing system of claim 15, wherein the first semiconductor package is a dual die package and the second semiconductor package is a mono die package.

18. The computing system of claim 15, wherein the semiconductor dies at a first layer of the first semiconductor package form a first one of the ranks, and the semiconductor dies at a second layer of the first semiconductor package form a second one of the ranks.

19. The computing system of claim 15, wherein a number of semiconductor dies associated with the first semiconductor package is different from a number of semiconductor dies associated with the second semiconductor package.

20. The computing system of claim 15, wherein the computing system is one of a plurality of servers forming a data center.

* * * * *